United States Patent
Sun et al.

(10) Patent No.: US 11,094,897 B2
(45) Date of Patent: Aug. 17, 2021

(54) FLEXIBLE DISPLAY DEVICE (71) Applicants: Chongqing BOE Display Technology Co., Ltd., Chongqing (CN); BOE Technology Group Co., Ltd., Beijing (CN)

(72) Inventors: Shicheng Sun, Beijing (CN); Jonguk Kwak, Beijing (CN); Dawei Shi, Beijing (CN); Weixin Meng, Beijing (CN); Kai Zhang, Beijing (CN); Wei Zhang, Beijing (CN); Shuang Hu, Beijing (CN)

(73) Assignees: Chongqing BOE Display Technology Co., Ltd., Beibei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/672,674

(22) Filed: Nov. 4, 2019

(65) Prior Publication Data
US 2020/0280006 A1  Sep. 3, 2020

(30) Foreign Application Priority Data

Feb. 28, 2019  (CN) .......................... 201910152221.3

(51) Int. Cl.
*H01L 51/00* (2006.01)
*G01J 5/08* (2006.01)
*G06F 1/16* (2006.01)

(52) U.S. Cl.
CPC ........ *H01L 51/0097* (2013.01); *G01J 5/0853* (2013.01); *G06F 1/1643* (2013.01)

(58) Field of Classification Search
CPC ... H01L 51/0097; G01J 5/0853; G06F 1/1643
See application file for complete search history.

(56) References Cited

U.S. PATENT DOCUMENTS 5,831,693 A * 11/1998 McCartney, Jr. ... G02F 1/13318
349/42
8,096,068 B2 * 1/2012 Van Rens ................. G09F 9/35
40/514

(Continued)

FOREIGN PATENT DOCUMENTS

CN  1753419 A  3/2006
CN  1764829 A  4/2006

(Continued)

OTHER PUBLICATIONS

First Chinese Office Action issued in corresponding Chinese Patent Application No. 201910152221.3 dated Sep. 22, 2020.

*Primary Examiner* — Nitin Patel
*Assistant Examiner* — Robert M Stone
(74) *Attorney, Agent, or Firm* — Arent Fox LLP; Michael Fainberg (57) ABSTRACT

Disclosed is a flexible display device including: a housing comprising an accommodating chamber, a first opening is formed at one end of accommodating chamber; a flexible display screen accommodated in the accommodating chamber, the flexible display screen includes a substrate, a first infrared receiving circuit formed on one side of the substrate, and an anode formed on a side of the first infrared receiving circuit away from the substrate; a hole through are formed on the anode, orthographic projections of the hole, onto the substrate cover an orthographic projection of the first infrared receiving circuit onto the substrate; an infrared transmitting circuit arranged in the first opening; a reel is arranged in the accommodating chamber; a control circuit signal-connected with the first infrared receiving circuit.

9 Claims, 8 Drawing Sheets (56) References Cited

U.S. PATENT DOCUMENTS

| | | | | |
|---|---|---|---|---|
| 8,804,324 B2* | 8/2014 | Bohn | G06F 1/1616 | 345/1.1 |
| 9,230,468 B2* | 1/2016 | Kwack | G06F 1/1652 | |
| 9,258,396 B2* | 2/2016 | Hwang | G06F 1/1677 | |
| 9,293,111 B2* | 3/2016 | Kwack | G09G 5/005 | |
| 9,342,106 B2* | 5/2016 | Nurmi | G06F 1/1652 | |
| 9,609,225 B2* | 3/2017 | Kwon | H04N 5/23293 | |
| 9,727,203 B2* | 8/2017 | Lee | G06F 3/04817 | |
| 10,268,253 B2* | 4/2019 | Liu | G06F 1/3218 | |
| 10,365,690 B2* | 7/2019 | In | G06F 1/1652 | |
| 2002/0070910 A1* | 6/2002 | Fujieda | G09F 9/301 | 345/85 |
| 2005/0030518 A1* | 2/2005 | Nishi | G01J 1/4204 | 356/3.04 |
| 2005/0176470 A1* | 8/2005 | Yamakawa | G09G 3/001 | 455/566 |
| 2006/0060762 A1 | 3/2006 | Chan et al. | | |
| 2008/0070649 A1* | 3/2008 | Uchida | H04M 1/0216 | 455/575.4 |
| 2009/0298547 A1* | 12/2009 | Kim | G06F 1/1643 | 455/566 |
| 2010/0117975 A1* | 5/2010 | Cho | G06F 3/0416 | 345/173 |
| 2010/0201641 A1* | 8/2010 | Tetsuhashi | G06F 3/04842 | 345/173 |
| 2012/0262367 A1* | 10/2012 | Chiu | G06F 1/1626 | 345/156 |
| 2013/0265257 A1* | 10/2013 | Jung | G06F 3/038 | 345/173 |
| 2013/0314387 A1* | 11/2013 | Kwack | G09G 5/005 | 345/207 |
| 2013/0314762 A1* | 11/2013 | Kwack | G02F 1/09 | 359/280 |
| 2013/0335311 A1* | 12/2013 | Kim | G06F 1/1694 | 345/156 |
| 2014/0002430 A1* | 1/2014 | Kwack | G09G 3/3225 | 345/207 |
| 2014/0375219 A1* | 12/2014 | Lee | G06F 3/1423 | 315/153 |
| 2015/0022561 A1* | 1/2015 | Ikeda | G09F 9/301 | 345/690 |
| 2015/0146387 A1* | 5/2015 | Lee | G06F 1/1679 | 361/749 |
| 2015/0220118 A1* | 8/2015 | Kwak | G09G 5/003 | 345/667 |
| 2015/0309637 A1* | 10/2015 | Sakuishi | G02F 1/13338 | 345/174 |
| 2015/0338888 A1* | 11/2015 | Kim | G06F 3/04886 | 345/156 |
| 2016/0034047 A1 | 2/2016 | Lee et al. | | |
| 2016/0085319 A1 | 3/2016 | Kim et al. | | |
| 2016/0246330 A1* | 8/2016 | Kim | G06F 1/1652 | |
| 2016/0246559 A1* | 8/2016 | Jung | G06F 3/1431 | |
| 2016/0307545 A1* | 10/2016 | Lee | G09G 5/346 | |
| 2016/0358552 A1* | 12/2016 | Wang | G09G 3/3648 | |
| 2016/0381014 A1* | 12/2016 | Kim | H04W 12/06 | 726/7 |
| 2019/0121390 A1* | 4/2019 | Yang | G09G 3/3208 | |
| 2019/0180073 A1* | 6/2019 | Zhang | G06K 9/0004 | |
| 2019/0259351 A1* | 8/2019 | Yoon | H01L 51/0097 | |

FOREIGN PATENT DOCUMENTS

| | | |
|---|---|---|
| CN | 102832351 A | 12/2012 |
| CN | 103426384 A | 12/2013 |
| CN | 104505005 A | 4/2015 |
| CN | 105320352 A | 2/2016 |
| CN | 105843464 A | 8/2016 |
| CN | 107103840 A | 8/2017 |
| CN | 107223279 A | 9/2017 |
| CN | 107831999 A | 3/2018 |
| CN | 108566458 A | 9/2018 |
| CN | 108922917 A | 11/2018 |
| CN | 208424468 U | 1/2019 |
| EP | 3407176 A1 | 11/2018 |

* cited by examiner

FLEXIBLE DISPLAY DEVICE

CROSS-REFERENCE TO RELATED APPLICATION

This application claims priority of Chinese Patent Application No. 201910152221.3, filed on Feb. 28, 2019, which is hereby incorporated by reference in its entirety.

FIELD

The present disclosure relates to the field of display technologies, and particularly to a flexible display device.

BACKGROUND

As the flexible display technologies are developing constantly, the era of flexible, foldable, and curled products are coming. If a display product cannot be turned off in a timely manner after being bent and folded, then power of the product may be wasted, and even the product may be controlled improperly; and if the display is turned off or turned on manually in a non-intelligent manner, the experience of its user may be degraded seriously.

SUMMARY

Some embodiments of the disclosure provide a flexible display device including:

a housing comprising an accommodating chamber, a first opening is formed at one end of the accommodating chamber;

a flexible display screen accommodated in the accommodating chamber, wherein the flexible display screen comprises a substrate, a first infrared receiving circuit formed on one side of the substrate, and an anode formed on a side of the first infrared receiving circuit away from the substrate; a hole through which light can be transmitted, are formed on the anode, orthographic projections of the hole, onto the substrate cover an orthographic projection of the first infrared receiving circuit onto the substrate, and the first infrared receiving circuit is configured to face in position the infrared transmitting circuit when the flexible display screen is folded, to receive first infrared light rays transmitted by the infrared transmitting circuit;

an infrared transmitting circuit arranged in the first opening, an orthographic projection of the infrared transmitting circuit onto the substrate overlaps with the orthographic projection of the first infrared receiving circuit onto the substrate in a folding state of the housing;

wherein a reel is arranged in the accommodating chamber and configured to drive the housing to be switched between the folding state and a unfolding state;

a control circuit signal-connected with the first infrared receiving circuit, and configured to control the flexible display screen to be turned off, when the first infrared receiving circuit receives first infrared light rays transmitted by the infrared transmitting circuit.

Optionally, the flexible display screen includes the flexible display screen includes an outer display screen and an inner display screen; and when the flexible display screen is folded due to the housing being in the folding state, the outer display screen wraps the inner display screen.

Optionally, the flexible display device further includes a first through-hole formed in the first opening; wherein the infrared transmitting circuit is arranged in the first through-hole so that the infrared transmitting circuit transmits the first infrared light rays and second infrared light rays respectively from openings on two sides of the first through-hole;

wherein a second opening is further formed at one end of the accommodating chamber, and is on a side of the first opening far away from the accommodating chamber;

wherein a second infrared receiving circuit is arranged in the second opening and configured to receive the second infrared light rays transmitted by the infrared transmitting circuit and reflected by an object when the flexible display screen is folded or unfolded, and to receive the first infrared light rays transmitted by the infrared transmitting circuit and reflected by the object when the flexible display screen is unfolded; and the control circuit is signal-connected with the second infrared receiving circuit, and configured to control the outer display screen to be turned off, in response to that the second infrared receiving circuit receives the second infrared light rays transmitted by the infrared transmitting circuit and reflected by the object, and to control the inner display screen to be turned off, in response to that the second infrared receiving circuit receives the first infrared light rays transmitted by the infrared transmitting circuit and reflected by the object.

Optionally, the flexible display device further includes a second through-hole formed in the second opening, and the second infrared receiving circuit is arranged in the second through-hole; when the flexible display screen is folded or unfolded, the second infrared receiving circuit receives the second infrared light rays from one end of the second through-hole, and when the flexible display screen is unfolded, the second infrared receiving circuit receives the first infrared light rays from other end of the second through-hole.

Optionally, the infrared transmitting circuit includes two infrared light-emitting diodes arranged opposite to each other, and two filtering sheets, wherein:

one of the infrared light-emitting diodes is configured to emit the first infrared light rays from the opening at one end of the first through-hole;

the other infrared light-emitting diode is configured to emit the second infrared light rays from the opening at the other end of the first through-hole; and the filtering sheets are respectively arranged at openings of the ends of the first through-hole.

Optionally, the infrared transmitting circuit includes one infrared light-emitting diode, two filtering sheets, and one reflecting mirror, wherein:

the infrared light-emitting diode is configured to emit infrared light rays, a part of which exit the opening at one end of the first through-hole as the first infrared light rays, the reflecting mirror is arranged in the first through-hole and at an angle with a light-emitting direction of the infrared light-emitting diode to reflect a part of the infrared light rays emitted by the infrared light-emitting diode so that the reflected light rays exit the opening at the other end of the first through-hole as the second infrared light rays, and the filtering sheets are respectively arranged at openings of the ends of the first through-hole; or the infrared light-emitting diode is configured to emit infrared light rays, a part of which exit the opening at one end of the first through-hole as the second infrared light rays, the reflecting mirror is arranged in the first through-hole and at an angle with a light-emitting direction of the infrared light-emitting diode to reflect a part of the infrared light rays emitted by the infrared light-emitting diode so that the reflected light rays exit the opening at the other end of the first through-hole as the first infrared light rays, and the filtering sheets are respectively arranged at the openings of the ends of the first through-hole.

Optionally, the second infrared receiving circuit includes two infrared photoelectric diodes arranged opposite to each other, and two filtering sheets, wherein:

one of the infrared photoelectric diodes is configured to receive the first infrared light rays from the opening at one end of the second through-hole;

the other infrared photoelectric diodes is configured to receive the second infrared light rays from the opening at the other end of the second through-hole; and the filtering sheets are respectively arranged at the openings of the ends of the second through-hole.

Optionally, the infrared transmitting circuit includes one infrared photoelectric diode, two filtering sheets, and one reflecting mirror, wherein:

the infrared photoelectric diode is configured to receive the first infrared light ray, and the reflecting mirror is arranged in the second through-hole so that the reflecting mirror reflects the second infrared light rays to the infrared photoelectric diode, and the infrared photoelectric diode receives the second infrared light rays, and the filtering sheets are respectively arranged at the openings at the ends of the second through-hole; or the infrared photoelectric diode is configured to receive the second infrared light ray, and the reflecting mirror is arranged in the second through-hole so that the reflecting mirror reflects the first infrared light rays to the infrared photoelectric diode, and the infrared photoelectric diode receives the first infrared light rays, and the filtering sheets are respectively arranged at the openings at the ends of the second through-hole.

Optionally, the infrared transmitting circuit is arranged on a middle frame of the housing in the opening of the housing.

Optionally, the flexible display device further includes a display area and a non-display area, and the first infrared receiving circuit is formed in the non-display area.

Optionally, the first infrared receiving circuit includes a plurality of infrared receivers connected in parallel with each other.

DETAILED DESCRIPTION OF THE EMBODIMENTS

The technical solutions according to the embodiments of the disclosure will be described below clearly and fully with reference to the drawings in the embodiments of the disclosure. Apparently the embodiments to be described are only a part but all of the embodiments of the disclosure. Based upon some embodiments here of the disclosure, all of other embodiments which can occur to those ordinarily skilled in the art without any inventive effort shall come into the claimed scope of the disclosure.

As illustrated in FIG. 1, FIG. 2, FIG. 10, and FIG. 13, some embodiments of the disclosure provides a flexible display device including:

an infrared transmitting circuit 1;

a flexible display screen 2 which can be folded and unfolded, where the flexible display screen 2 includes a substrate, a first infrared receiving circuit 3 formed on one side of the substrate, and an anode 800 formed on a side of the first infrared receiving circuit 3 away from the substrate, a hole 801 through which light can be transmitted, are formed on the anode 800, orthographic projection of the hole 801 through which light can be transmitted, onto the substrate covers an orthographic projection of the first infrared receiving circuit 3 onto the substrate, and the first infrared receiving circuit 3 is configured to face in position the infrared transmitting circuit 1 when the flexible display screen 2 is folded, to receive first infrared light rays transmitted by the infrared transmitting circuit 1; and a control circuit 5 signal-connected with the first infrared receiving circuit 3, and configured to control the flexible display screen 2 to be turned off, when the first infrared receiving circuit 3 receives the first infrared light rays transmitted by the infrared transmitting circuit 1.

The flexible display device above includes the infrared transmitting circuit 1, the flexible display screen 2, the first infrared receiving circuit 3, and the control circuit 5, where the flexible display screen 2 includes the substrate, the first infrared receiving circuit 3 formed on one side of the substrate, and the anode 800 formed on the side of the first infrared receiving circuit 3 away from the substrate, and the control circuit 5 is signal-connected with the first infrared receiving circuit 3, and configured to control the display state of the flexible display screen 2 according to the reception state of the first infrared receiving circuit 3. Optionally, the hole 801 through which light can be transmitted are formed on the anode, and the orthographic projections of the hole 801 through which light can be transmitted, onto the substrate cover the orthographic projection of the first infrared receiving circuit 3 onto the substrate, so the first infrared receiving circuit 3 on the substrate can receive light rays incident through the hole through which light can be transmitted. When the flexible display screen 2 is folded, the first infrared receiving circuit 3 faces in position of the infrared transmitting circuit 1, and can generate varying current directly, and transmit the current to the control circuit 5 connected therewith upon reception of the first infrared light rays transmitted by the infrared emitter, and the control circuit 5 controls the flexible display screen 2 to be turned off; and alike when the first infrared receiving circuit 3 cannot receive the first infrared light rays, it can generate varying current, and the control circuit 5 resumes the display state of the flexible display screen 2 to an awoken state.

In the flexible display device according to some embodiments of the disclosure, the first infrared receiving circuit 3 and the infrared transmitting circuit 1 are arranged in different areas so that the flexible display screen 2 can be turned off automatically in the folding state, and awoken automatically in the unfolding state to thereby save a space, improve the experience of its user, and lower power consumption.

Accordingly the display screen of the flexible display product in a folded, curled, unfolded, or another state can be switched intelligently between being turned off and awoken, by modifying a structure design of the flexible display device.

Figure 1:
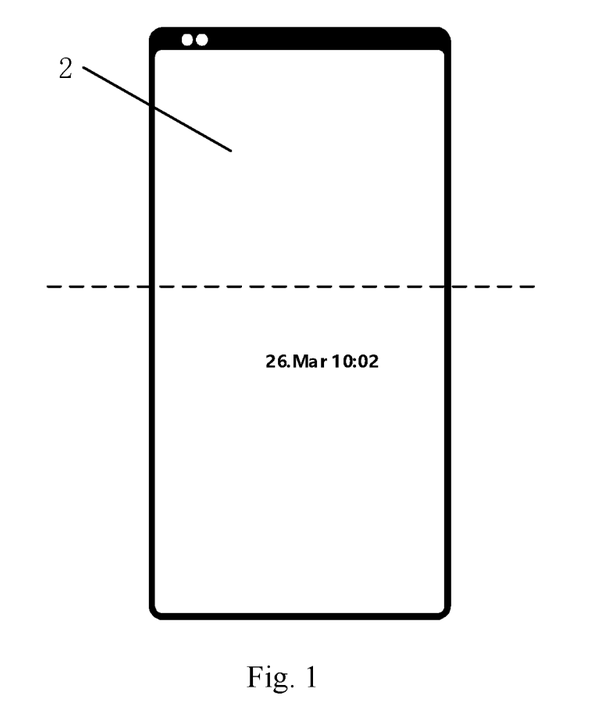
FIG. 1 is a schematic structural diagram of a flexible display device according to some embodiments of the disclosure.
Figure 2:
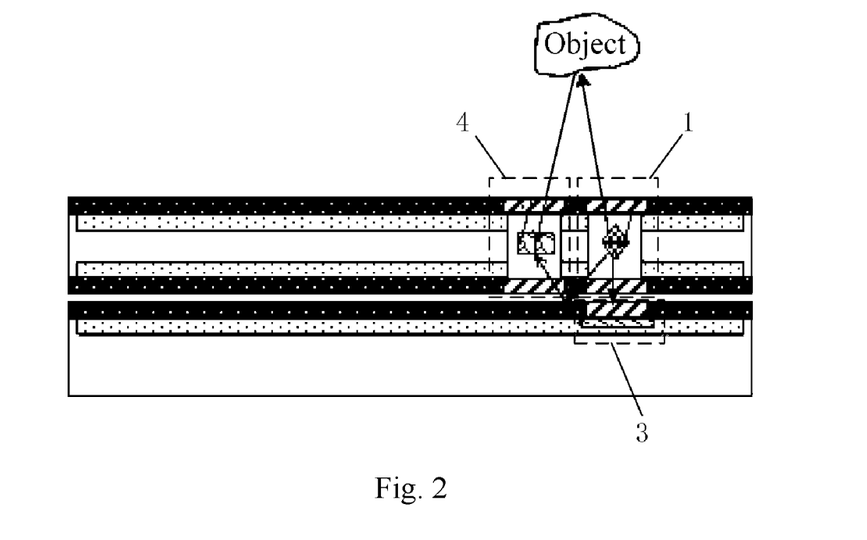
FIG. 2 is a schematic structural diagram of the flexible display device according to some embodiments of the disclosure, which is folded.
Figure 4:
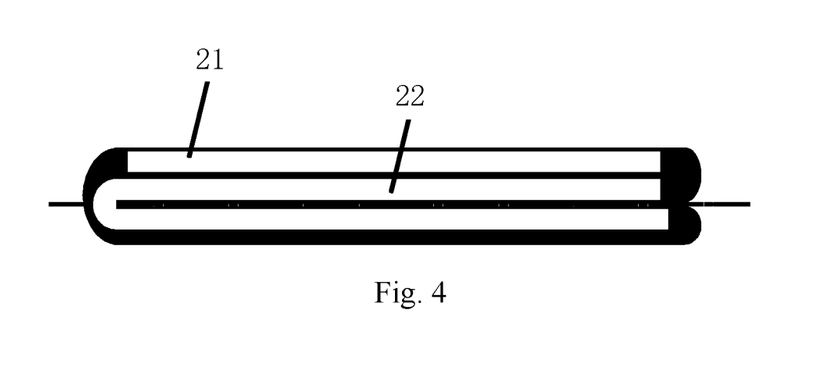
FIG. 4 is another schematic structural diagram of the flexible display device according to some embodiments of the disclosure, which is folded.

In an optional implementation, as illustrated in FIG. 4, the flexible display screen 2 includes an outer display screen 21 and an inner display screen 22; and as illustrated in FIG. 2, when the flexible display screen 2 is folded, the outer display screen 21 wraps the inner display screen 22, the first infrared receiving circuit 3 receives the first infrared light rays transmitted by the infrared transmitting circuit 1, and the control circuit 5 controls the inner display screen 22 to be turned off. The flexible display device according to some embodiments of the disclosure can display on two sides, and be folded; and optionally when the flexible display screen 2 is unfolded, both the outer display screen 21 and the inner display screen 22 can display, and when the flexible display screen 2 is bent (i.e., folded), the control circuit 5 controls the inner display screen 22 to be turned off, and the outer display screen 21 can display.

It shall be noted that as illustrated in FIG. 2, when the flexible display screen 2 is bent, the first infrared receiving circuit 3 faces in position the infrared transmitting circuit 1, and at this time, the first infrared receiving circuit 3 can receive the first infrared light rays transmitted by the infrared transmitting circuit 1; and since the control circuit 5 is signal-connected with the first infrared receiving circuit 3, the control circuit 5 controls the inner display screen 22 to be turned off so that the inner display screen 22 can be turned off automatically when the inner display screen 22 in the flexible display device according to some embodiments of the disclosure is switched from the unfolding state to the folding state; and alike when the flexible display screen 2 is resumed from the folding state to the unfolding state, the first infrared receiving circuit 2 cannot receive the first infrared light rays transmitted by the infrared transmitting circuit 1, and at this time, the control circuit 5 awakes the inner display screen 2.

Further to the technical solution above, there is the following optional implementation.

The flexible display device according to some embodiments of the disclosure further includes a first through-hole in which the infrared transmitting circuit 1 is arranged so that the infrared transmitting circuit 1 can transmit the first infrared light rays and second infrared light rays respectively from openings on two sides of the first through-hole.

Figure 3:
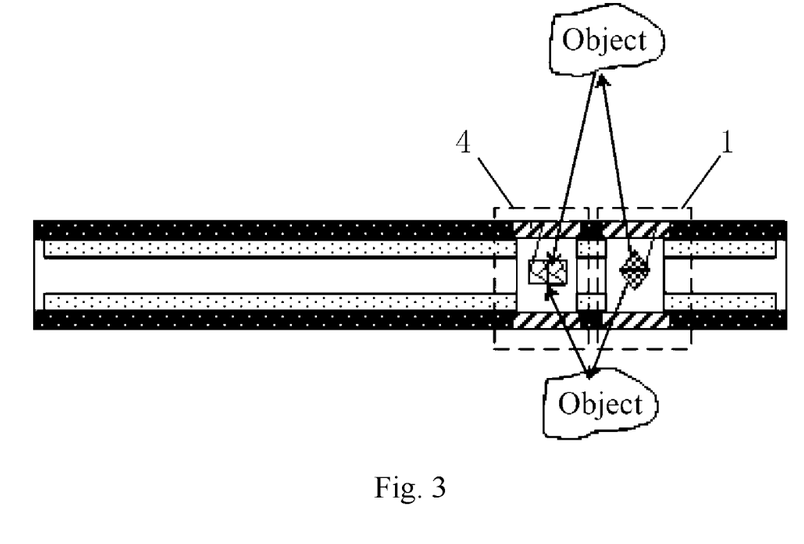
FIG. 3 is a schematic structural diagram of the flexible display device according to some embodiments of the disclosure, which is unfolded.

The flexible display device according to some embodiments of the disclosure further includes a second infrared receiving circuit 4, and as illustrated in FIG. 2 and FIG. 3, the second infrared receiving circuit 4 is configured to receive the second infrared light rays transmitted by the infrared transmitting circuit 1 and reflected by an object when the flexible display screen 2 is folded or unfolded, and to receive the first infrared light rays transmitted by the infrared transmitting circuit 1 and reflected by the object when the flexible display screen 2 is unfolded.

The control circuit 5 is signal-connected with the second infrared receiving circuit 4, and configured to control the outer display screen 21 to be turned off, when the second infrared receiving circuit 4 receives the second infrared light rays transmitted by the infrared transmitting circuit 1 and reflected by the object, and to control the inner display screen 22 to be turned off, when the second infrared receiving circuit 4 receives the first infrared light rays transmitted by the infrared transmitting circuit 1 and reflected by the object.

It shall be noted that the infrared transmitting circuit 1 is arranged in the first through-hole of the flexible display screen 2, and when the flexible display screen 2 is unfolded, the infrared transmitting circuit 1 can cooperate with the second infrared receiving circuit 4 to turn off and turn on the inner display screen 22 and the outer display screen 21; and when the flexible display screen 2 is folded, the infrared transmitting circuit 1 can cooperate with the first infrared receiving circuit 3 to turn off and turn on the inner display screen 22, and the infrared transmitting circuit 1 can cooperate with the second infrared receiving circuit 4 to turn off and turn on the outer display screen 21. Apparently the structure above has the advantage of saving a space and providing a diversity of functions.

Further to the technical solution above, in order to further save a space, in a preferable implementation, a second through-hole is formed on the flexible display device according to some embodiments of the disclosure, and the infrared receiving circuit is arranged in the second through-hole, so that when the flexible display screen 2 is folded or unfolded, the second infrared receiving circuit 4 receives the second infrared light rays from one end of the second through-hole, and when the flexible display screen 2 is unfolded, the second infrared receiving circuit 4 receives the first infrared light rays from other end of the second through-hole.

It shall be noted that there may be a number of possible structures of the infrared transmitting circuit 1, where the structures includes at least one of the following structures.

Figure 5:
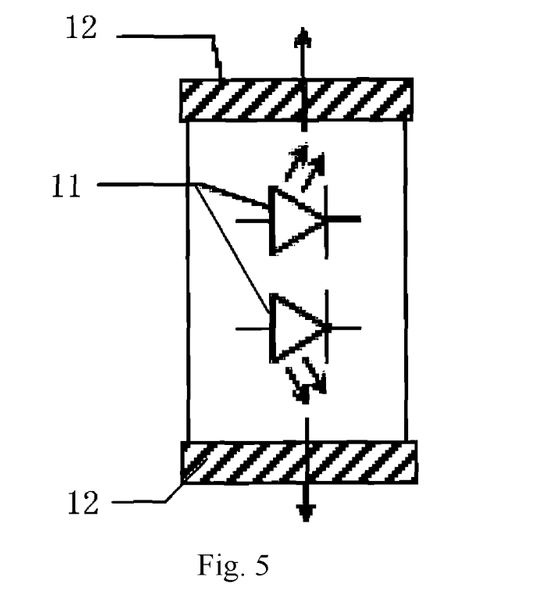
FIG. 5 is a schematic structural diagram of an infrared transmitting circuit in the flexible display device according to some embodiments of the disclosure.

In a first structure, as illustrated in FIG. 5, the infrared transmitting circuit 1 includes two infrared light-emitting diodes 11 arranged opposite to each other, and two filtering sheets 12, where:

one of the infrared light-emitting diodes 11 is configured to emit the first infrared light rays from the opening at one end of the first through-hole;

the other infrared light-emitting diode is configured to emit the second infrared light rays from the opening at the other end of the first through-hole; and the filtering sheets 12 are arranged at the openings at the respective ends of the first through-hole.

It shall be noted that in the technical solution above, the infrared light emitted by the infrared light-emitting diodes 11 is typically light at a single wavelength, and the filtering sheets 12 are arranged to shield the infrared light of the infrared light-emitting diodes 11; and the two infrared light-emitting diodes 11 are designed in s simple structure and with high reliability.

Figure 6:
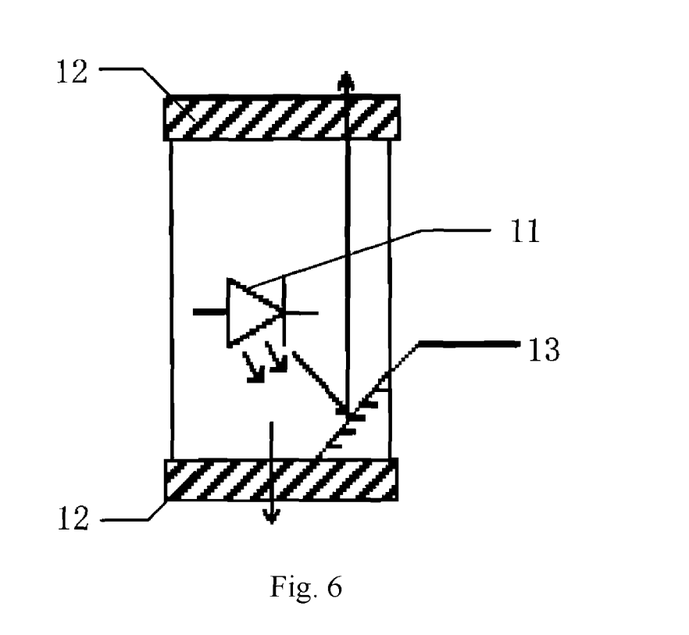
FIG. 6 is another schematic structural diagram of the infrared transmitting circuit in the flexible display device according to some embodiments of the disclosure.

In a second structure, as illustrated in FIG. 6, the infrared transmitting circuit 1 includes one infrared light-emitting diode 11, two filtering sheets 12, and one reflecting mirror 13.

The infrared light-emitting diode 11 is configured to emit infrared light rays, a part of which can exit the opening at one end of the first through-hole as the first infrared light rays.

The reflecting mirror 13 is configured to reflect a part of the infrared light rays emitted by the infrared light-emitting diode as reflected light rays so that the reflected light rays can exit the opening at the other end of the first through-hole as the second infrared light rays.

The filtering sheets 12 are arranged at the openings at the respective ends of the first through-hole.

In a third structure, as illustrated in FIG. 6, the infrared light-emitting diode 11 is configured to emit infrared light rays, a part of which can exit the opening at one end of the first through-hole as the second infrared light rays.

The reflecting mirror 13 is configured to reflect a part of the infrared light rays emitted by the infrared light-emitting diode as reflected light rays so that the reflected light rays can exit the opening at the other end of the first through-hole as the first infrared light rays.

The filtering sheets 12 are arranged at the openings at the respective ends of the first through-hole.

It shall be noted that only one infrared light-emitting diode 11 is arranged in the technical solutions of the second structure and the third structure so that a cost of fabricating the flexible display device according to some embodiments of the disclosure can be lowered in this structural design.

Alike when the second infrared receiving circuit 4 is arranged in the second through-hole, there may be also a number of possible structures of the second infrared receiving circuit 4, where the structures includes at least one of the following structures.

Figure 7:
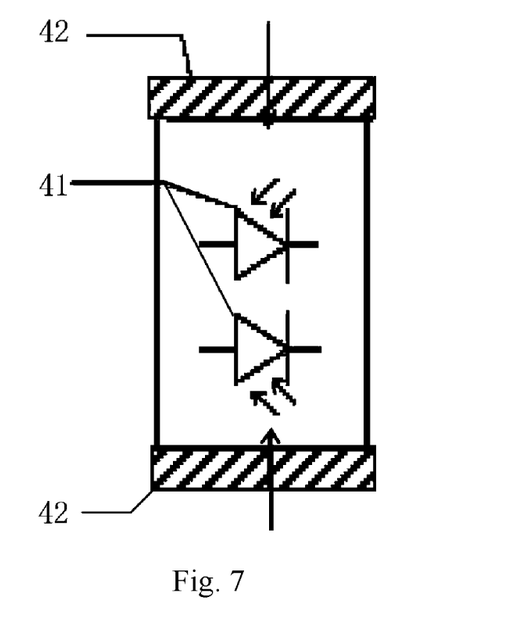
FIG. 7 is a schematic structural diagram of a second infrared transmitting circuit in the flexible display device according to some embodiments of the disclosure.

In a first structure, as illustrated in FIG. 7, the second infrared receiving circuit 4 includes two infrared photoelectric diodes 41 arranged opposite to each other, and two filtering sheets 42.

One of the infrared photoelectric diodes 41 is configured to receive the first infrared light rays from the opening at one end of the second through-hole.

The other infrared photoelectric diodes 41 is configured to receive the second infrared light rays from the opening at the other end of the second through-hole.

The filtering sheets 42 are arranged at the openings at the respective ends of the second through-hole.

Figure 8:
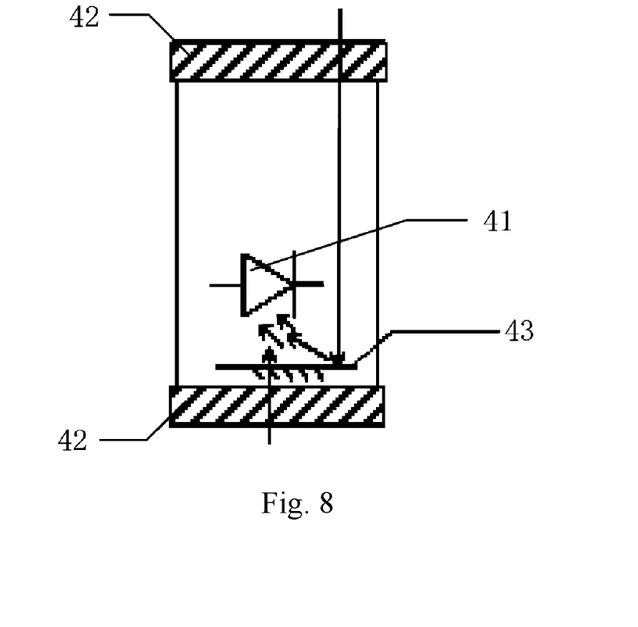
FIG. 8 is another schematic structural diagram of the second infrared transmitting circuit in the flexible display device according to some embodiments of the disclosure.

In a second structure, as illustrated in FIG. 8, the infrared transmitting circuit 1 includes one infrared photoelectric diode 41, two filtering sheets 42, and one reflecting mirror 43.

The infrared photoelectric diode 41 is configured to receive the first infrared light ray, and to receive the second infrared light rays reflected by the reflecting mirror 43, and the filtering sheets 42 are arranged at the openings at the respective ends of the second through-hole.

In a third structure, as illustrated in FIG. 8, the infrared photoelectric diode 41 is configured to receive the second infrared light ray, and to receive the first infrared light rays reflected by the reflecting mirror 43, and the filtering sheets 42 are arranged at the openings at the respective ends of the second through-hole.

It shall be noted that while a mobile is operating daily, if only the inner display screen is displaying, then the display state of the outer display screen 21 shall not be switched improperly due to the object, which would otherwise have resulted in an unnecessary operation, so the two infrared light-emitting diodes or the two infrared photoelectric diodes can be designed so that the respective diodes are identified or driven separately and intermittently, and their particular design can be adjusted as needed, although some embodiments of the disclosure will not be limited thereto.

It shall be noted that in a particular implementation, when the flexible display device is a mobile phone, the infrared transmitting circuit 1 and the second infrared receiving circuit 4 can be arranged on a middle frame, that is, the first through-hole and the second through-hole are arranged on the middle frame.

Further to the technical solution above, it shall be noted that the flexible display screen 2 includes a display area and a non-display area, and in order to avoid the first infrared receiving circuit 3 from interfering with normal displaying in the display area, the first infrared receiving circuit 3 is formed in the non-display area in an optional implementation.

Further to the technical solution above, when the flexible display device according to some embodiments of the disclosure includes the inner display screen 22 and the outer display screen 21, the display device operates under the following operating principle:

when the object approaches the unfolded inner display screen 22 or outer display screen 21, the infrared light (the first infrared light rays and/or the second infrared light rays) transmitted by the infrared transmitting circuit 1 is reflected by the object, and thereafter incident on an infrared receiver of the second infrared receiving circuit 4 through the filtering sheet at the second through-hole so that photo current is generated, and the distance from the approaching object is sensed, so the screen can be turned off when the face of a person to make a call approaches the screen;

when the flexible display screen 2 is folded, a part of the inner display screen 22 is brought together with the other part thereof, and at this time, the infrared emitter on the inner display screen 22 side emits the first infrared light through the opening of the first through-hole, which is incident on the first infrared receiving circuit 3 arranged in the flexible display screen 2 through the filtering sheet, so that photo current is generated and transmitted to the control circuit 5, and a processor in the control circuit 5 recognizes the operation of bending the flexible display screen 2, and sends an instruction to turn off the screen.

Moreover, the photo current is reversible, so an influence on the characteristic of a semiconductor is also reversible to some extent, and in order to avoid the infrared light from affecting the first infrared receiving circuit 3 after the infrared light has been incident thereon for a long period of time while the flexible display screen is being folded, the infrared light-emitting diodes in the infrared transmitting circuit 1, and the first infrared receiving circuit 3 can be designed so that they operate intermittently, and they can be driven once at an interval of several frames as needed in reality.

Figure 9:
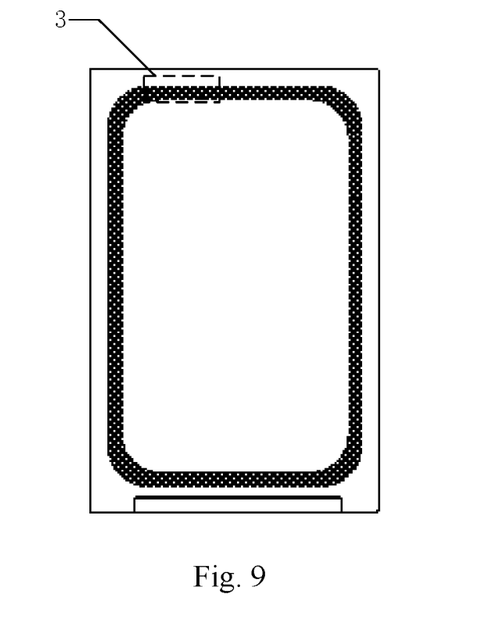
FIG. 9 is a further schematic structural diagram of the flexible display device according to some embodiments of the disclosure.
Figure 11:
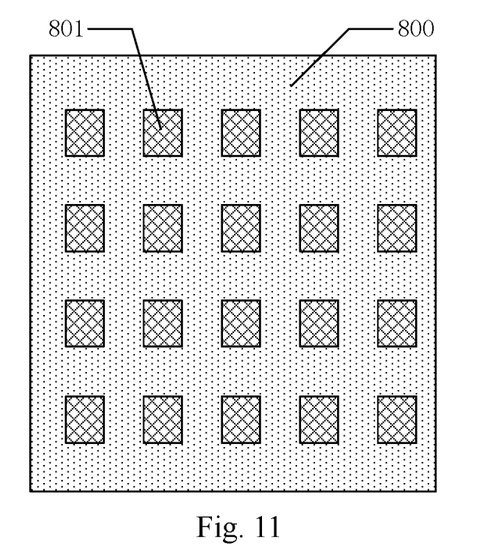
FIG. 11 is a schematic structural diagram of the first infrared receiving circuit in the flexible display device according to some embodiments of the disclosure.

It shall be noted that the structure of the first infrared receiving circuit 3 is designed as follows:

the infrared receiver is arranged below the anode at the distal end of a data signal line (i.e., opposite to an integrated circuit) in the flexible display device as illustrated in FIG. 9. Optionally, the infrared receiver is arranged below the anode at the distal end of the data signal line, and a light path is created through the holes through which light can be transmitted, of the metal anode instead of spare pixels as illustrated in FIG. 11.

Figure 10:
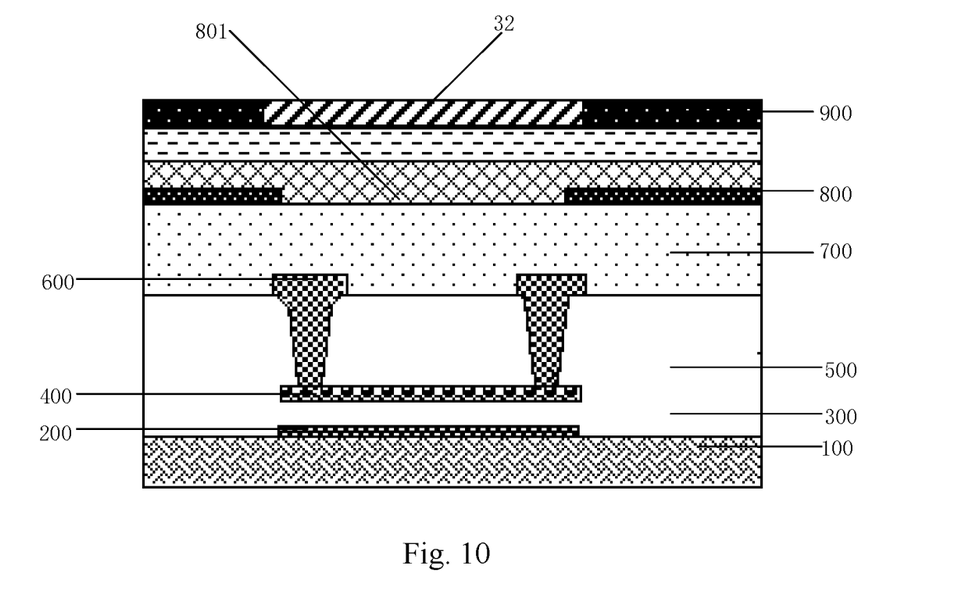
FIG. 10 is a schematic structural diagram of layers of a first infrared receiving circuit in the flexible display device according to some embodiments of the disclosure.

The process steps of forming each infrared receiver are as follows:

as illustrated in FIG. 10, a flexible substrate 10, a metal light-shielding layer 200, a first inorganic insulation layer 300, a doped semiconductor P—Si layer 400, a second inorganic insulation layer 500, a traveling line metal layer 600, an organic insulation layer 700, and the anode 800 (including the holes 801 through which light can be transmitted) are formed on the substrate in that order, and the filtering sheets 32 are arranged on a cover plate 900 in position corresponding to the respective holes 801 through which light can be transmitted, of the anode 800 in a one-to-one manner.

Moreover, it shall be noted that the vapor-plating and encapsulation structures, and the structures of the polarizing sheets, the optical adhesive, the encapsulation cover plate, etc., are substantially the same as in the existing flexible display screen.

It shall be noted that in the flexible display device according to some embodiments of the disclosure, as per the principle of light-induced leakage current in a semiconductor, the doped semiconductor P—Si layer is arranged on the substrate, a PN-like junction is formed (or a PN junction is added by increasing N-doping), reverse bias voltage is applied, and a change in reverse current is detected when light is incident to thereby detect incident infrared light so as to control the flexible display screen 2 to be turned on and turned off.

Further to the technical solution above, in order to improve the reception sensitivity of the first infrared receiving circuit 3, preferably the first infrared receiving circuit 3 includes a plurality of infrared receivers 31 connected in parallel with each other.

Figure 12:
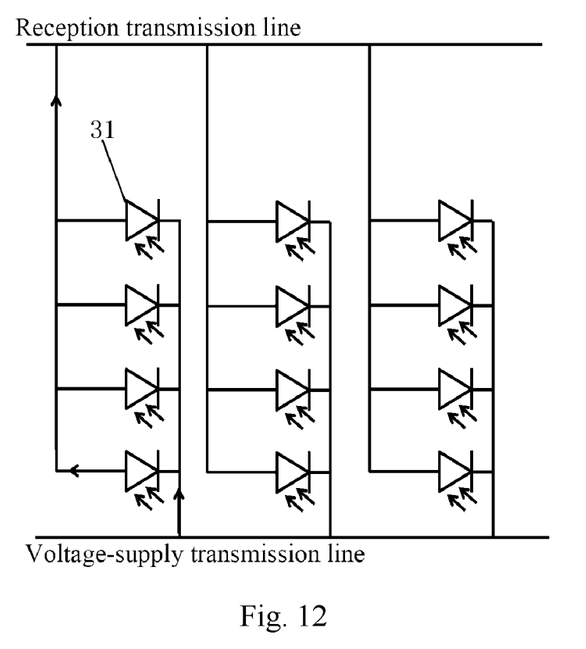
FIG. 12 is a schematic structural diagram of connections in a circuitry of the first infrared receiving circuit in the flexible display device according to some embodiments of the disclosure.

It shall be noted that each small PN junction can sense a tiny change in current, so a plurality of infrared receivers 31 can be designed to be connected in parallel with each other as illustrated in FIG. 12 to form an infrared receiver area, and the plurality of infrared receivers can be arranged as illustrated in FIG. 11, where one of the infrared receivers is arranged below the hole through which light can be transmitted, of each anode 800.

Further to the technical solution above, it shall be noted that the doped semiconductor P—Si layer (i.e., the PN junction) can be formed in at least one of the following implementations.

In a first implementation:

a P—Si thin film is formed on the first inorganic insulation layer;

the P—Si thin film is doped using threshold voltage; and one side of the doped P—Si thin film is P-doped to form a heavily doped area, while protecting the other side of the P—Si thin film using a protective layer, to form the doped semiconductor P—Si layer.

In a second implementation:

the PN junction is formed at a gate line layer using photo-resist after a normal low-temperature Poly-Si process is performed on the P—Si thin film. Particular steps thereof are as follows:

the first step is to plate the photo-resist layer with metal molybdenum, and thereafter form a doped area in a photo-lithograph process;

to remove the metal molybdenum in the doped area in an etching process; and to dope the photo-resist layer with phosphor, to inject holes, and to strip the photo-resist layer;

the second step is to coat the P—Si thin film with photo-resist;

to expose the gate line layer in a photolithograph process;

to remove the metal molybdenum in the doped area in an etching process; and to dope the photo-resist layer with boron, to inject electrons, and to strip the photo-resist layer.

It shall be noted that the PN junction can be formed after the first and second steps.

Figure 13:
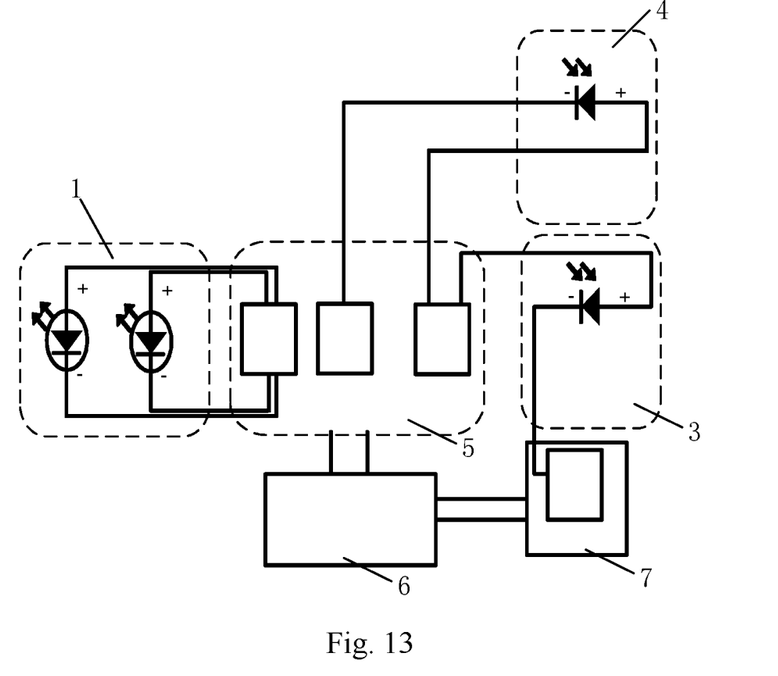
FIG. 13 is a schematic structural diagram of a circuitry of the flexible display device according to some embodiments of the disclosure.

In a design of circuit circuits in the flexible display device in this technical solution, as illustrated in FIG. 13, the infrared transmitting circuit 1 and the second infrared receiving circuit 4 are driven and controlled separately by the control circuit 5 in the flexible display device, the first infrared receiving circuit 3 integrated on the flexible display screen 2 is provided by a driving chip 7 with reverse voltage (the driving chip is controlled by the processor 6 in the flexible display device), and a reverse current processing circuit is controlled by the control circuit 5 in the flexible display device.

Figure 14:
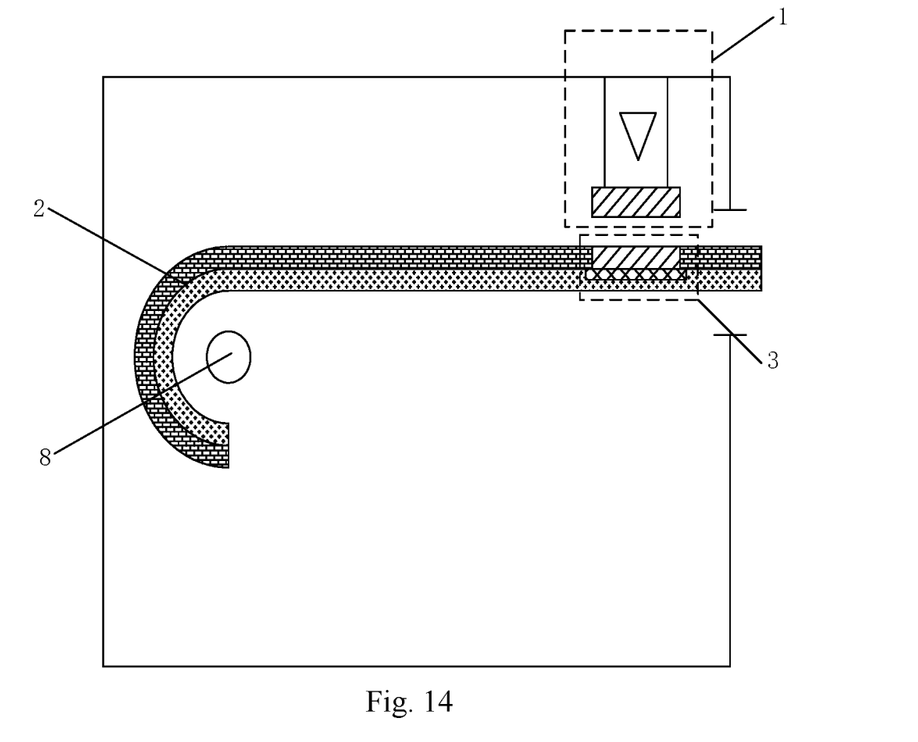
FIG. 14 is a further schematic structural diagram of the flexible display device according to some embodiments of the disclosure.

In another optional implementation, as illustrated in FIG. 14, the flexible display device according to some embodiments of the disclosure further includes a housing including an accommodating chamber, where an opening is formed at one end of the accommodating chamber, the infrared transmitting circuit 1 is arranged in the opening of the housing, and a reel 8 arranged in the accommodating chamber is configured to drive the flexible display screen 2 to be switched between the folding state and the unfolding state.

It shall be noted that when the flexible display device according to some embodiments of the disclosure is folded, the flexible display screen can be curled around the reel 8 to be stored in the accommodating chamber of the housing.

In this technical solution, the infrared transmitting circuit 1 and the first infrared receiving circuit 3 are arranged respectively in the flexible display device and the flexible display screen 2, optionally as follows:

when the infrared emitters are arranged at the openings, the infrared receivers are arranged on the substrate in the flexible display screen 2; and when the screen is folded, the infrared receivers receive the first infrared light rays emitted by the infrared emitters, varying current is generated in the receiver semiconductors and transmitted to the control circuit, and the control circuit 5 determines that the flexible product has been folded, as a result of an analysis, and thus turns off the screen; and when the screen is unfolded, the receivers cannot receive any infrared light, so the screen is turned on as described above.

It shall be noted that the design of the first infrared receiving circuit 3 in this technical solution is the same as the design of the flexible and bendable product above, so a repeated description thereof will be omitted here.

Figure 15:
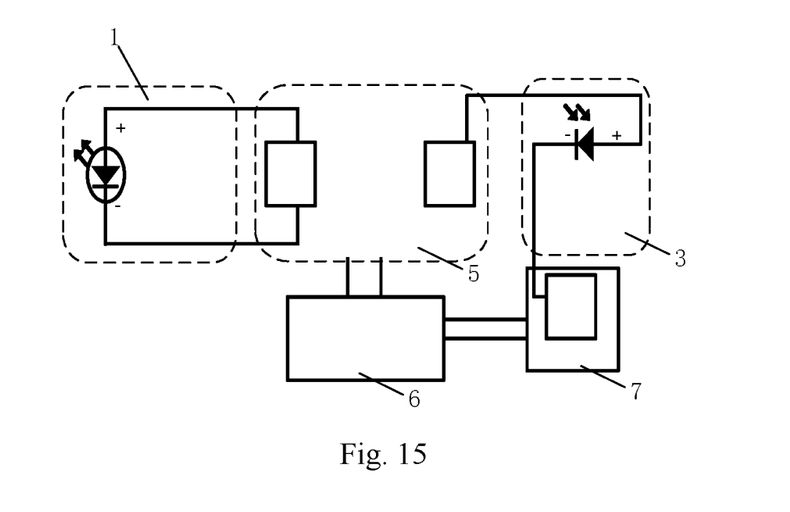
FIG. 15 is a further schematic structural diagram of the circuitry of the flexible display device according to some embodiments of the disclosure.

A design of circuit circuits in the flexible display device in this technical solution will be described below:

as illustrated in FIG. 15, the infrared transmitting circuit 1 is driven and controlled separately by the control circuit 5 in the flexible display device, the first infrared receiving circuit 3 on the flexible display device 2 is provided by a driving chip 7 with reverse voltage (the driving chip is controlled by the processor 6 in the flexible display device), and a reverse current processing circuit is controlled by the control circuit 5 in the flexible display device.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A flexible display device, comprising:
a housing comprising an accommodating chamber, a first opening is formed at one end of the accommodating chamber;
a flexible display screen accommodated in the accommodating chamber, wherein the flexible display screen comprises a substrate, a first infrared receiving circuit formed on one side of the substrate, and an anode formed on a side of the first infrared receiving circuit away from the substrate; wherein, a hole is formed on the anode, wherein, an orthographic projection of the hole, onto the substrate cover an orthographic projection of the first infrared receiving circuit onto the substrate;
an infrared transmitting circuit arranged in the first opening, an orthographic projection of the infrared transmitting circuit onto the substrate overlaps with the orthographic projection of the first infrared receiving circuit onto the substrate in a folding state of the housing; and
the first infrared receiving circuit is configured to face in position the infrared transmitting circuit when the flexible display screen is folded, to receive first infrared light rays transmitted by the infrared transmitting circuit;
wherein a reel is arranged in the accommodating chamber and configured to drive the housing to be switched between the folding state and a unfolding state;
a control circuit signal-connected with the first infrared receiving circuit, and configured to control the flexible display screen to be turned off, when the first infrared receiving circuit receives first infrared light rays transmitted by the infrared transmitting circuit;
wherein the flexible display screen comprises an outer display screen and an inner display screen; and when the flexible display screen is folded due to the housing being in the folding state, the outer display screen wraps the inner display screen;
wherein the flexible display device further comprises a first through-hole formed in the first opening;
wherein the infrared transmitting circuit is arranged in the first through-hole so that the infrared transmitting circuit transmits the first infrared light rays and second infrared light rays respectively from openings on two sides of the first through-hole;
wherein a second opening is further formed at one end of the accommodating chamber, and is on a side of the first opening far away from the accommodating chamber;
wherein a second infrared receiving circuit is arranged in the second opening and configured to receive the second infrared light rays transmitted by the infrared transmitting circuit and reflected by an object when the flexible display screen is folded or unfolded, and to receive the first infrared light rays transmitted by the infrared transmitting circuit and reflected by the object when the flexible display screen is unfolded; and
the control circuit is signal-connected with the second infrared receiving circuit, and configured to control the outer display screen to be turned off, in response to that the second infrared receiving circuit receives the second infrared light rays transmitted by the infrared transmitting circuit and reflected by the object, and to control the inner display screen to be turned off, in response to that the second infrared receiving circuit receives the first infrared light rays transmitted by the infrared transmitting circuit and reflected by the object.

2. The flexible display device according to claim 1, further comprises a second through-hole formed in the second opening, and the second infrared receiving circuit is arranged in the second through-hole; when the flexible display screen is folded or unfolded, the second infrared receiving circuit receives the second infrared light rays from one end of the second through-hole, and when the flexible display screen is unfolded, the second infrared receiving circuit receives the first infrared light rays from other end of the second through-hole.

3. The flexible display device according to claim 2, wherein the second infrared receiving circuit comprises two infrared photoelectric diodes arranged opposite to each other, and two filtering sheets, wherein:
one of the infrared photoelectric diodes is configured to receive the first infrared light rays from the opening at one end of the second through-hole;
the other infrared photoelectric diodes is configured to receive the second infrared light rays from the opening at the other end of the second through-hole; and
the filtering sheets are respectively arranged at the openings of the ends of the second through-hole.

4. The flexible display device according to claim 2, wherein the infrared transmitting circuit comprises one infrared photoelectric diode, two filtering sheets, and one reflecting mirror, wherein:
the infrared photoelectric diode is configured to receive the first infrared light ray, and the reflecting mirror is arranged in the second through-hole so that the reflecting mirror reflects the second infrared light rays to the infrared photoelectric diode, and the infrared photoelectric diode receives the second infrared light rays, and the filtering sheets are respectively arranged at the openings at the ends of the second through-hole; or
the infrared photoelectric diode is configured to receive the second infrared light ray, and the reflecting mirror is arranged in the second through-hole so that the reflecting mirror reflects the first infrared light rays to the infrared photoelectric diode, and the infrared photoelectric diode receives the first infrared light rays, and the filtering sheets are respectively arranged at the openings at the ends of the second through-hole.

5. The flexible display device according to claim 1, wherein the infrared transmitting circuit comprises two infrared light-emitting diodes arranged opposite to each other, and two filtering sheets, wherein:
one of the infrared light-emitting diodes is configured to emit the first infrared light rays from the opening at one end of the first through-hole;

the other infrared light-emitting diode is configured to emit the second infrared light rays from the opening at the other end of the first through-hole; and the filtering sheets are respectively arranged at openings of the ends of the first through-hole.

6. The flexible display device according to claim 1, wherein the infrared transmitting circuit comprises one infrared light-emitting diode, two filtering sheets, and one reflecting mirror, wherein:

the infrared light-emitting diode is configured to emit infrared light rays, a part of which exit the opening at one end of the first through-hole as the first infrared light rays, the reflecting mirror is arranged in the first through-hole and at an angle with a light-emitting direction of the infrared light-emitting diode to reflect a part of the infrared light rays emitted by the infrared light-emitting diode so that the reflected light rays exit the opening at the other end of the first through-hole as the second infrared light rays, and the filtering sheets are respectively arranged at openings of the ends of the first through-hole; or the infrared light-emitting diode is configured to emit infrared light rays, a part of which exit the opening at one end of the first through-hole as the second infrared light rays, the reflecting mirror is arranged in the first through-hole and at an angle with a light-emitting direction of the infrared light-emitting diode to reflect a part of the infrared light rays emitted by the infrared light-emitting diode so that the reflected light rays exit the opening at the other end of the first through-hole as the first infrared light rays, and the filtering sheets are respectively arranged at the openings of the ends of the first through-hole.

7. The flexible display device according to claim 1, wherein the infrared transmitting circuit is arranged on a middle frame of the housing in the opening of the housing.

8. The flexible display device according to claim 1, further comprises a display area and a non-display area, and the first infrared receiving circuit is formed in the non-display area.

9. The flexible display device according to claim 8, wherein the first infrared receiving circuit comprises a plurality of infrared receivers connected in parallel with each other.

* * * * *